United States Patent [19]
Isono et al.

[11] Patent Number: 5,458,985
[45] Date of Patent: Oct. 17, 1995

[54] STAMPER

[75] Inventors: Hitoshi Isono, Tenri; Hirotoshi Takemori, Nara, both of Japan

[73] Assignee: Sharp Kabushiki Kaisha, Osaka, Japan

[21] Appl. No.: 291,190

[22] Filed: Aug. 16, 1994

Related U.S. Application Data

[62] Division of Ser. No. 56,612, May 3, 1993, Pat. No. 5,385,638, which is a continuation of Ser. No. 798,595, Nov. 26, 1991, abandoned.

[30] Foreign Application Priority Data

Nov. 28, 1990 [JP] Japan ............................ 2-331062
Dec. 27, 1990 [JP] Japan ............................ 2-416754

[51] Int. Cl.⁶ ...................... G11B 7/26; B32B 3/18; B32B 7/00
[52] U.S. Cl. .............. 428/601; 428/621; 428/630; 428/662; 428/667; 428/680; 428/686; 428/934; 425/385; 425/DIG. 30
[58] Field of Search .................... 428/600, 601, 428/609, 621, 630, 661, 662, 667, 680, 686, 687, 935; 425/385, 810, DIG. 30

[56] References Cited

U.S. PATENT DOCUMENTS

| | | | |
|---|---|---|---|
| 3,478,684 | 11/1969 | Schafler et al. | 428/667 |
| 3,532,587 | 10/1970 | Unger et al. | 428/686 |
| 3,558,290 | 1/1971 | Baier et al. | 428/667 |
| 3,715,793 | 2/1973 | Kefalas et al. | 428/686 |
| 4,262,875 | 4/1981 | Nyman et al. | 425/810 |
| 4,500,392 | 2/1985 | Slaten | 204/5 |
| 4,563,145 | 1/1980 | de Meij | 425/385 |
| 4,565,772 | 1/1986 | Takeoka et al. | 430/320 |
| 4,723,903 | 2/1988 | Okazaki et al. | 428/600 |

FOREIGN PATENT DOCUMENTS

| | | | |
|---|---|---|---|
| 50-23453 | 3/1975 | Japan | 425/810 |
| 2-77594 | 3/1990 | Japan . | |

OTHER PUBLICATIONS

Translation of Japanese Kokai Patent Publication 2-77,594, Mar. 1990, Tsucniya, Y., pp. 1–5.
Abstract for JP 3036021, Feb. 1991. 1 page.

Primary Examiner—John Zimmerman
Attorney, Agent, or Firm—David G. Conlin; Kevin J. Fournier

[57] ABSTRACT

A method of manufacturing a stamper includes the steps of coating a flat surface of a substrate with photosensitive material; directing light to a specified position on the photosensitive material to expose it; developing the photosensitive material to make a minute photoresist pattern; etching the substrate to a specified depth with a mask of the photoresist pattern; removing the photoresist as the mask to make a glass master; arbitrarily forming a first nickel layer on a surface of the glass master; forming an intermediate layer of a metal having a smaller linear expansion coefficient than nickel over the first nickel layer; forming a second nickel layer on the intermediate layer to form a conductive film having a two- or three-stratum structure; arbitrarily subjecting the whole substrate to a process to make nickel passive; forming an electroformed layer on the conductive film by an electroforming process; and separating the conductive film from the glass master.

5 Claims, 7 Drawing Sheets

STAMPER

This is a divisional of application Ser. No. 08/056,612, now U.S. Pat. No. 5,385,638, filed on May 3, 1993, which is a continuation of U.S. Ser. No. 07/798,595 filed on Nov. 26, 1991, now abandoned.

BACKGROUND OF THE INVENTION

The present invention relates to a method of manufacturing a stamper which is used in making a plastic substrate having a minute pattern of an order in submicrons, such as guide grooves for tracking in an optical disc, prepits for designating sector addresses, circuit lattice patterns for a hologram, and the like, by injection molding or the like.

DESCRIPTION OF THE RELATED ART

In a magneto-optical disc and additionally, write once type optical disc, guide grooves for tracking and prepits formed of minute irregularities for expressing information about sector addresses and the like must be formed in advance on a surface of the disc. A method of manufacturing a stamper employed in making a substrate of such an optical disc by injection molding or the like will be briefly explained.

Prior Art

Figures 2A, 2B:
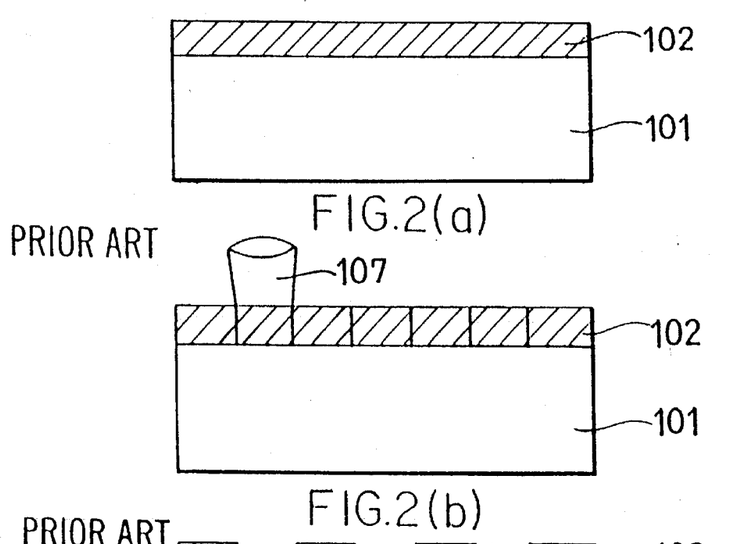
Figure 2C:
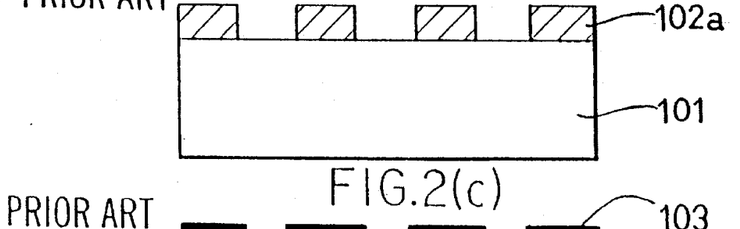

First, as shown in FIG. 2(a), a glass substrate 101 is coated with photoresist 102, and after laser light 107 cuts the photoresist 102, it is developed to form a desired irregularity pattern 102a (FIGS. 2(b) and 2(c)).

Figures 2D, 2E:
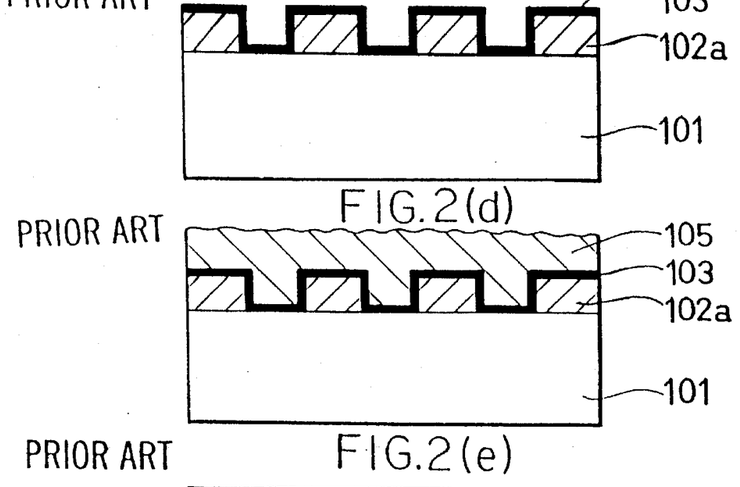
Figure 2F:
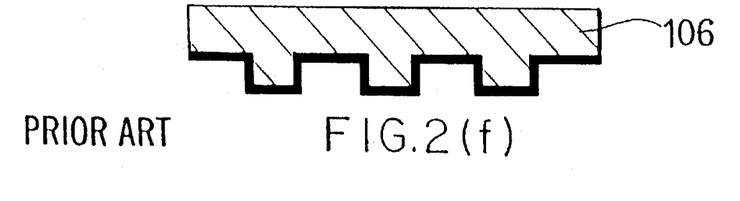

Then, as shown in FIG. 2(d), the glass substrate 101 having the irregularity pattern 102a is subjected to sputtering or vacuum evaporation to form a nickel or silver conductive film 103 over the glass substrate 101, and thereafter, an electroforming process is performed to form an electroformed layer 105 of a metal, such as nickel, in a desired thickness (FIG. 2(e)). After that, the electroformed layer 105 is separated from the glass substrate 101 to make a stamper 106 as shown in FIG. 2(f).

In the stamper manufacturing method as stated above, a glass master still has a photoresist pattern. There arise the following problems in making a stamper according to this method.

① It is necessary to make a minute pattern with high accuracy that a substrate is coated with photoresist uniformly with high reproducibility. For that purpose, a strict control must be performed concerning manufacturing conditions, such as coating conditions (temperature of fluid photoresist, its viscosity, rotation velocity of a spinner, etc.), coating environment (temperature, moisture, etc.), developing conditions (temperature of developer, amount of droplet, etc.), and manufacturing process.

② In separating the electroformed layer from the glass master, the photoresist remains on the electroformed layer, and therefore, the step of removing the remaining photoresist is necessary. For example, although a dry ashing method where oxygen plasma is directed to the photoresist to incinerate it, and a method employing a liquid for removing the photoresist are well-known, the remaining photoresist may be insufficiently removed, and this sometimes causes a deterioration of the stamper.

To solve the above problems, conventionally employed are the methods where a glass master is made of glass material and has an irregularity pattern directly formed on it by spatter etching, ion etching or plasma etching. FIG. 3 shows an ordinary stamper manufacturing method of this kind.

Figure 3A:
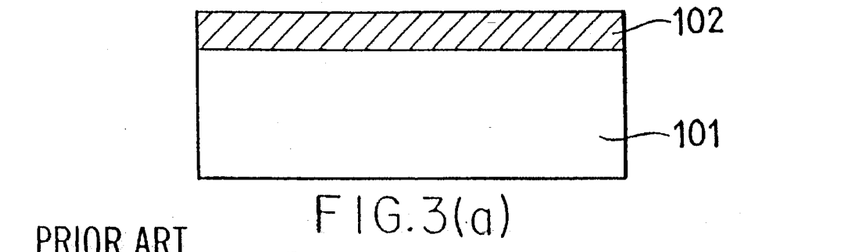
Figure 3B:
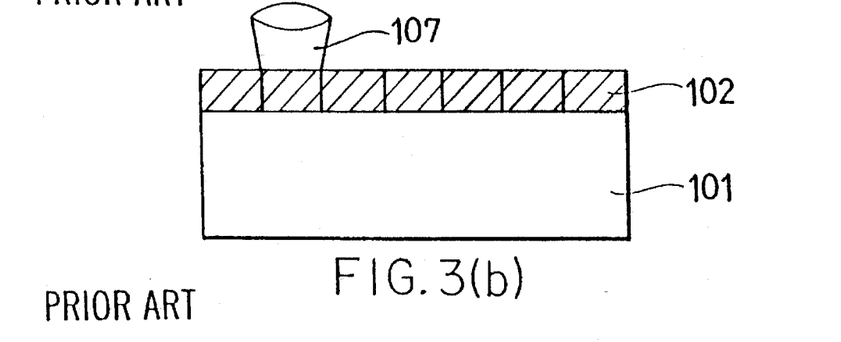
Figure 3C:
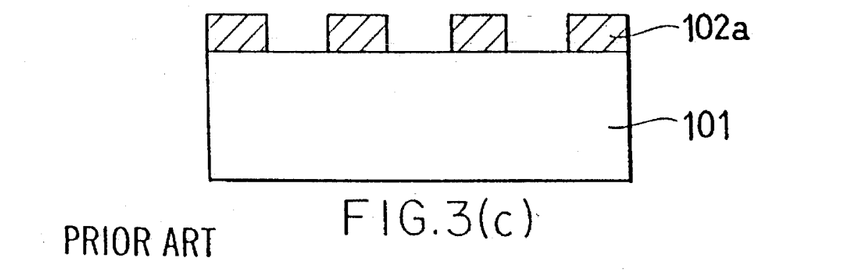

First, as shown in FIG. 3(a), a glass substrate 101 is coated with photoresist 102, and after laser light 107 cuts the photoresist 102, it is developed to form a desired irregularity pattern 102a (FIGS. 3(b) and 3(c)).

Figure 3D:
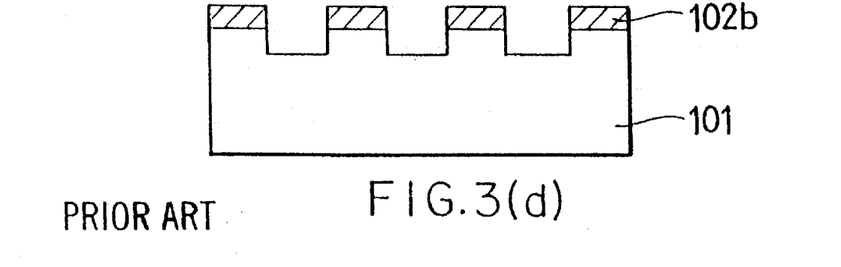
Figure 3E:
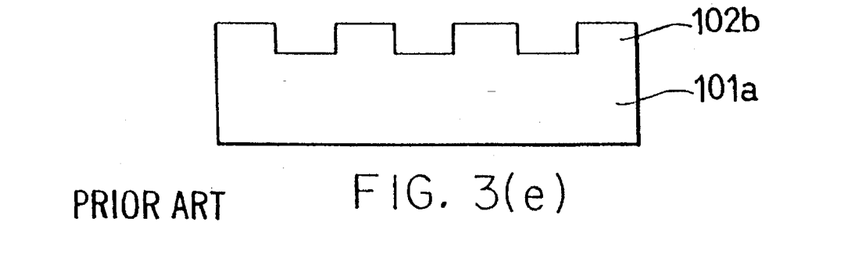
Figure 3F:
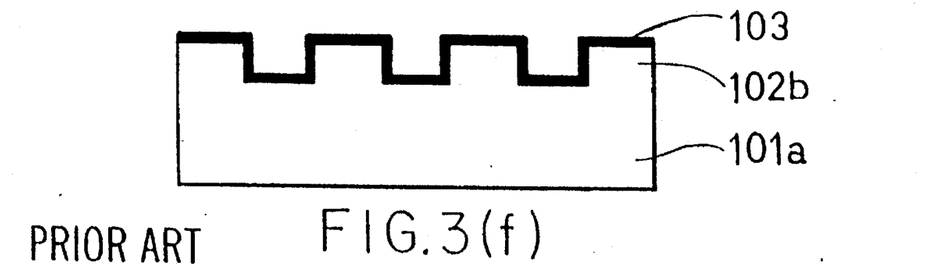
Figure 3G:
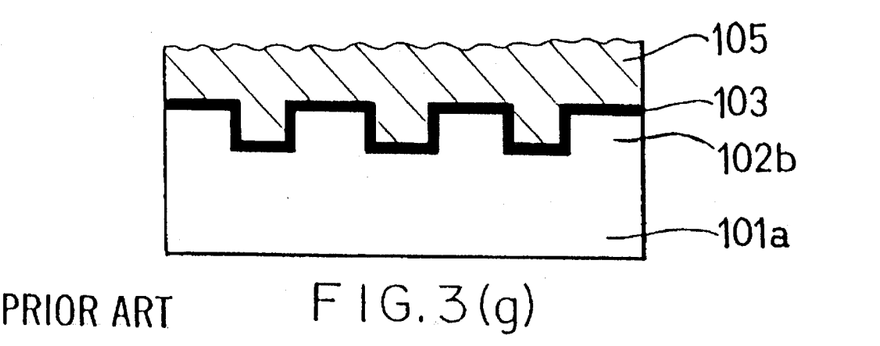

Then, the substrate 101 in FIG. 3(c) is etched by spatter etching, ion etching, plasma etching, or the like (FIG. 3(d)) to remove the photoresist 102, and thus, a glass master 101a is obtained (FIG. 3(e)). Moreover, a nickel or silver conductive layer film 103 is formed on the glass master 101a by sputtering, vacuum evaporation or the like, and then, an electroforming process is performed to form an electroformed layer 105 of a metal, such as nickel, in a desired thickness (FIGS. 3(f) and 3(g)). As to the conductive layer film 103, besides a nickel or silver single-stratum film, a silver-nickel two-stratum film disclosed in Japanese Unexamined Patent Publication No. 77594/1990 and a nickel-silver-nickel three-stratum film are conventionally employed.

Figure 3H:
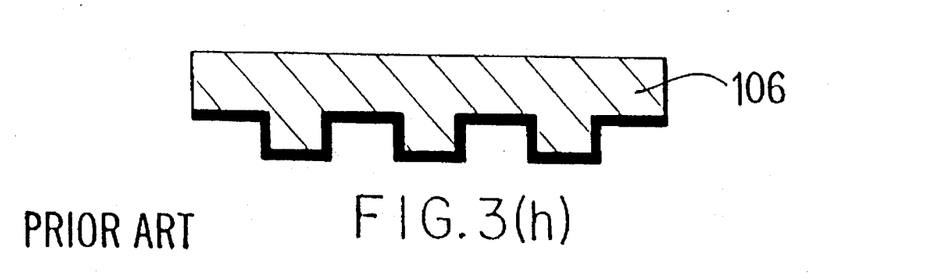

After that, the electroformed layer 105 is separated from the glass master 101a to make a stamper 106 as shown in FIG. 3(h).

Figure 4:
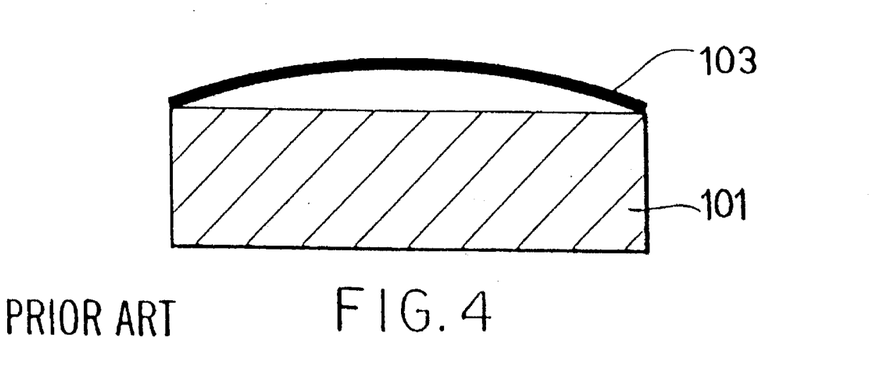
FIG. 4 is a cross-sectional view showing a conductive layer film which is removed from a glass substrate during an electroforming process in a conventional method of manufacturing a stamper.

However, such an improved method of the prior art has still problems as follows:

When a glass substrate on which an irregularity pattern is directly formed by spatter etching, ion etching or plasma etching is used as a preparation for a glass master, a nickel or silver single-stratum film, silver-nickel two-stratum film, or nickel-silver-nickel three-stratum film is formed as a conductive layer film to be subjected to an electroforming process, by sputtering, vacuum evaporation, or the like. However, while quartz and soda glass often used for a glass substrate are $(5 \text{ to } 6) \times 10^{-7}/°C$. and $(85 \text{ to } 92) \times 10^{-7}/°C$. in linear expansion coefficient, respectively, nickel and silver have relatively large linear expansion coefficients; nickel $133 \times 10^{-7}/°C$. and silver $197 \times 10^{-7}/°C$. Also, when the conductive layer film is a silver-nickel two-stratum film or nickel-silver-nickel three-stratum film, the conductive layer film in all has a larger linear expansion coefficient than the glass substrate. Thus, when the glass master is heated in an electrolyte during the electroforming process, the conductive layer film 103 flakes off the glass substrate 101 as shown in FIG. 4. Especially, when the conductive layer film has a nickel-silver-nickel three-stratum structure, the conductive layer film bends due to a temperature variation and flakes off the glass substrate unless the first and third nickel layer are identical in thickness to each other.

SUMMARY OF THE INVENTION

The present invention overcomes the above disadvantages, and it provides a method of manufacturing a stamper, in which a difference of linear expansion coefficients of a substrate and conductive layer film is reduced, and the conductive layer film is adapted not to bend with temperature variation, so that the conductive layer film can be prevented from flaking off the substrate during an electroforming process, and a good stamper can be obtained.

According to the present invention, a method of manufacturing a stamper includes the steps of coating a flat surface of a substrate with photosensitive material; directing light to a specified position on the photosensitive material to expose it; developing the photosensitive material to make a minute photoresist pattern; etching the substrate to a specified depth with a mask of the photoresist pattern; removing the photoresist as the mask to make a glass master; arbitrarily forming a first nickel layer on a surface of the glass master; forming an intermediate layer of a metal having a smaller linear expansion coefficient than nickel over the first nickel layer; forming a second nickel layer on the intermediate layer to form a conductive layer film having a two- or three-stratum structure; arbitrarily subjecting the whole substrate to a process to make nickel passive; forming an electroformed layer on the conductive layer film by an electroforming process; and separating the electroformed layer with or without the conductive layer film from the glass master.

BRIEF DESCRIPTION OF THE DRAWINGS

FIG. 1(a–g) is a diagram showing a procedure of manufacturing a stamper in accordance with an embodiment of the present invention;

FIGS. 2(a–f) and 3(a–h) are diagrams showing conventionally-performed general procedures of manufacturing a stamper;

FIG. 5(a–b) is a schematic diagram showing a method of manufacturing a stamper in accordance with another embodiment according to the present invention.

DETAILED DESCRIPTION OF THE PREFERRED EMBODIMENT

According to a stamper manufacturing method of the present invention, a flat substrate has its upper surface directly patterned in irregularities to make a glass master; a conductive layer film is arbitrarily formed in a two- or three-stratum structure comprised of a first nickel layer on the surface of the glass master; an intermediate layer of metal having a smaller linear expansion coefficient than nickel, a second nickel superlayer and the conductive layer film are arbitrarily treated into a passive state; the conductive layer film and an overlaid electroformed layer together are separated from the glass master; or the electroformed layer above is separated from the glass master to make a stamper.

The flat substrate employed herein in this invention includes a quarts or glass substrate.

A photosensitive material which is used as an ordinary positive-type photoresist may be applied; for example, novolak resin -o- quinone diazo compound is suitable. Commercially available are, for example, AZ series such as AZ1350 produced by Shipley Corporation, Waycoat series by Hunt Chem Corporation, etc.

For the light illuminating the photosensitive material, ordinary light, such as argon laser, is suitable.

A method of forming a specific irregularity pattern by etching a substrate to a specific depth with a mask of a photoresist pattern includes a method comprised of the steps of coating the substrate with photoresist to form a photoresist film, irradiating the photoresist film with laser light to cut it, developing the photoresist film to form a photoresist pattern, and subjecting the substrate to spatter etching, ion etching, plasma etching or the like with a mask of the resist pattern.

Moreover, the intermediate layer in this invention is preferably made of a metal having a smaller linear expansion coefficient than nickel, such as tantalum and chrome.

The intermediate layer is formed by means of sputtering or vacuum evaporation in a vacuum chamber, more specifically, by depositing tantalum or chrome over the first nickel layer on the glass master.

Both tantalum and chrome are relatively small in linear expansion coefficient, $65 \times 10^{-7}/°C$ and $62 \times 10^{-7}/°C$, respectively, so that they can be utilized to easily form a film by sputtering, vacuum evaporation, or the like. Also, they are substances excellent in anticorrosion. Thus, with a conductive layer film to be electroformed having a three-stratum structure where a tantalum or chrome layer is sandwiched by a nickel layer, the conductive layer film can be smaller in linear expansion coefficient than a nickel or silver single-stratum film, silver-nickel two-stratum film, or nickel-silver-nickel three-stratum film, and consequently, a difference of linear expansion coefficients of the conductive layer film and glass master can be reduced. As a result, the conductive layer film can be prevented from flaking off the glass master when subjected to an electroforming process.

The above-mentioned conductive layer film having two- or three-stratum structure has its strata formed successively in a vacuum chamber where vacuum condition is maintained without touching the outside air, so that the first nickel layer, if necessary, would be identical in thickness to the third nickel layer. In this invention, the first and third nickel layer are usually 200 to 500 Å in thickness, while the intermediate layer is usually 100 to 500 Å.

The roughness of the surface of the glass substrate is regulated by a surface flattening process so as to be usually Rmax 5 Å to 20 Å.

The nickel passive-state film is for separating the nickel electroformed layer thereover from the glass master, and is formed on the flat substrate surface where intermediate layers of a metal having a smaller linear expansion coefficient than nickel are formed layer after layer along the irregularity pattern, by soaking the whole substrate in a solution of potassium dichromate, subjecting it to an oxygen plasma process or the like. The soaking process can be performed by soaking the substrate in a solution of 5 wt % potassium dichromate for one minute. The oxygen plasma process can be performed by subjecting the substrate to a electric process under oxygen gas pressure 6 mtorr and in electric power 150 W for three minutes.

Preferably, since the glass master with the nickel passive-state film may easily flaw when the nickel electroformed layer separates from the glass master or during a purifying process after the separating, the substrate is purified by a solution of nitric acid or the like every time after the electroformed layer is separated from the glass master to dissolve and remove the nickel layer with the nickel passive-state film, a nickel layer is newly formed and subjected to a process to make nickel passive so that a renewed nickel passive-state film may be used. Approximately 20 wt % concentration of a solution of nitric acid may be usually enough.

As to the electroforming process, a wet-type method is suitable. A cathode of the glass master soaked in a solution of nickel salt, such as nickel sulfanate, nickel (II) chloride, or nickel borate, and an anode of metal nickel are electrically connected, and voltage is applied. An electrochemical reaction causes nickel to be deposited on the surface of the glass master, and thus, the electroforming process is effected.

(Embodiment 1)

FIG. 1 is a diagram showing manufacturing steps according to an embodiment of the present invention.

Figure 1A:
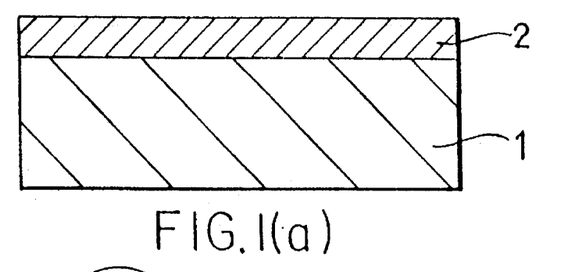
Figure 1B:
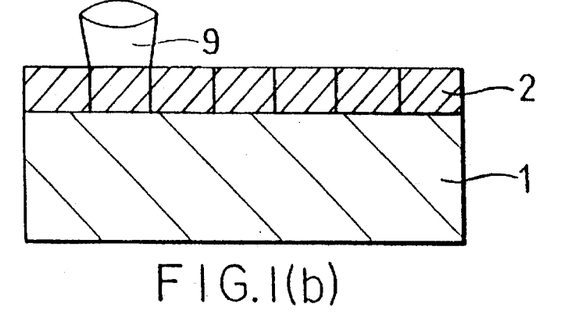
Figure 1C:
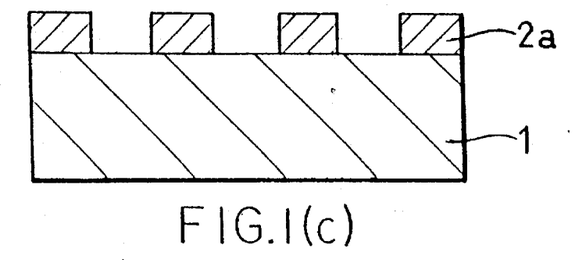
Figure 1D:
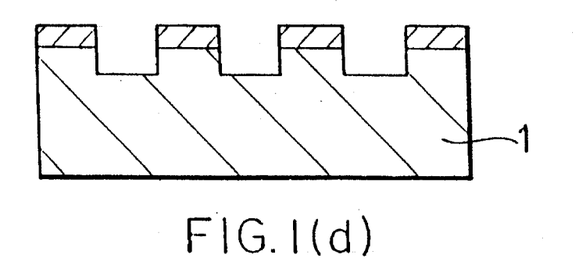

As shown in FIG. 1(a), the whole surface of a flat glass substrate 1 is coated with photoresist 2, photosensitive material, and laser light 9 is directed to specified spots of the photoresist 2 to expose it (FIG. 1(b)). After that, the photoresist 2 is developed to form a minute pattern 2a (FIG. 1(c)), and the glass substrate 1 is etched to about 800 Å depth with a mask of the photoresist pattern 2a (FIG. 1(d)). The etching includes physical etching, such as spatter etching, plasma etching, ion etching, and the like (in this embodiment, the spatter etching is employed).

Figure 1E:
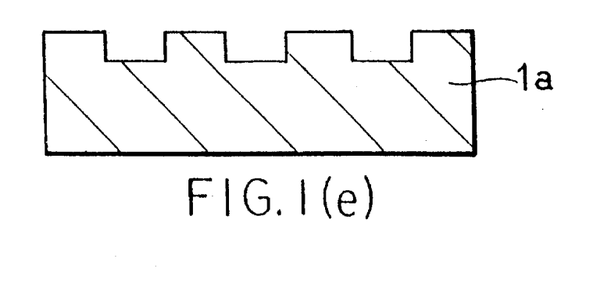

When the etching is completed, the photoresist pattern 2a as a mask is eliminated to form a glass master 1a (FIG. 1(e)).

Figure 1F:
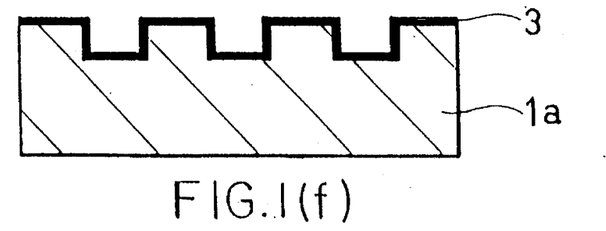
Figure 1G:
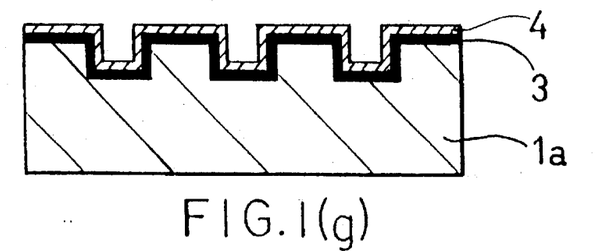
Figure 1H:
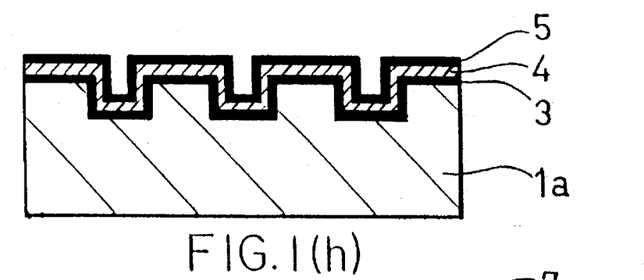

Next, the glass master 1a is subjected to sputtering in a vacuum chamber to form a first nickel layer 3 on its surface (FIG. 1(f)). The first nickel layer 3 is about 500 Å in thickness. After the first nickel layer 3 is formed, an intermediate layer 4 is made of tantalum having a smaller linear expansion coefficient than nickel as the first nickel layer 3 (FIG. 1(g)). The intermediate layer 4 is about 500 Å in thickness. After that, the whole substrate is subjected to sputtering to form a second nickel layer 5 identical in thickness to the first nickel layer 3 on the intermediate layer 4 (FIG. 1(h)). As a result, a conductive layer film 6 having a three-stratum structure comprised of the first nickel layer 3, intermediate layer 4 and second nickel layer 5, is formed on the surface of the glass master 1a. The first nickel layer 3, intermediate layer 4 and second nickel layer 5 are formed successively in a vacuum chamber maintained in about 8 mtorr vacuum degree without touching the outside air. This results in the layers 3, 4 and 5 adhering well to one another.

Figure 1I:
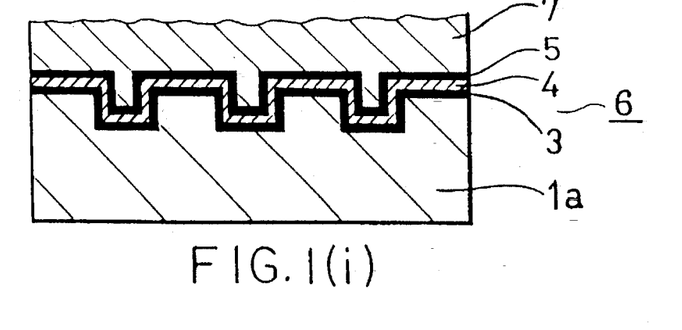
Figure 1J:
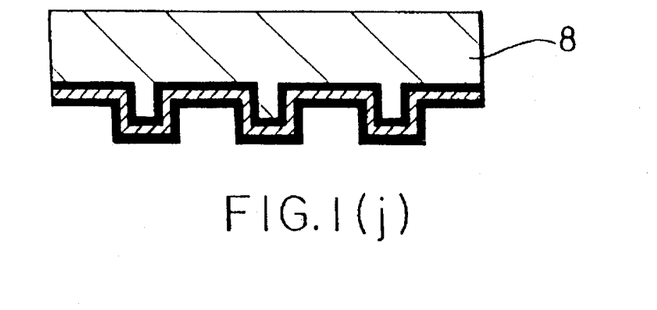

After that, an electroformed layer 7 is formed on the conductive layer film 6 by an electroforming process (FIG. 1(i)). The electroformed layer 7 is formed of nickel in thickness of about 300 μm. Then, the electroformed layer 7 with the conductive layer film 6 are separated from the glass master 1a (FIG. 1(j)) to make a stamper 8. The electroforming process itself may be a method well-known in this art.

(Embodiment 2)

A glass master 1a manufactured according to the previous embodiment is subjected to sputtering in a vacuum chamber to form a first nickel layer 3 (FIG. 1(f)). The first nickel layer 3 is about 300 Å in thickness. After the first nickel layer 3 is formed, an intermediate layer 4 is formed of tantalum having a smaller linear expansion coefficient than nickel over the first nickel layer 3 (FIG. 1(g)). The intermediate layer 4 may be about 200 Å in thickness assuming, for example, that the first nickel layer 3 is about 300 Å in thickness, so that the thickness ratio of the first nickel layer 3 to the intermediate layer 4 may become 3:2 to 6:5. The whole substrate is subjected to sputtering to form a second nickel layer 5 identical in thickness to the first nickel layer 3 on the intermediate layer 4 (FIG. 1(h)). As a result, a conductive layer film 6 having a three-stratum structure comprised of the first nickel layer 3, intermediate layer 4 and second nickel layer 5, is formed on the surface of the glass master 1a. The first nickel layer 3, intermediate layer 4 and second nickel layer 5 are formed successively in a vacuum chamber maintained in about 8 mtorr vacuum degree without touching the outside air. This results in the layers 3, 4 and 5 adhering well to one another.

The steps following the above steps to make a stamper 8 are all the same as those shown in the previous embodiment.

When the conductive layer film has the three-stratum structure, with the thickness ratio of the first nickel layer to the intermediate layer or the tantalum layer, 3:2 to 6:5, the conductive layer film can be more effectively prevented from flaking off the glass master during the electroforming process, particularly with the conductive layer film which is formed by depositing a first sublayer or a nickel layer of 300 Å thickness, an intermediate layer or a tantalum layer of 250 Å, and a second superlayer or a nickel layer of 300 Å by sputtering, much greater effect can be attained; for example, 100% yield can be attained in 20 times trial of the electroforming process. With the conductive layer film of which thickness ratio of the first nickel layer to the intermediate layer or the tantalum layer is not 3:2 to 6:5, for example, the conductive layer film which is formed by depositing a first sublayer or a nickel layer of 300 Å thickness, an intermediate layer or a tantalum layer of 400 Å, and a second superlayer or a nickel layer of 300 Å, poor results are observed at five times among 20 times trial of the electroforming process, and 75% yield is attained.

(Embodiment 3)

Figure 5A:
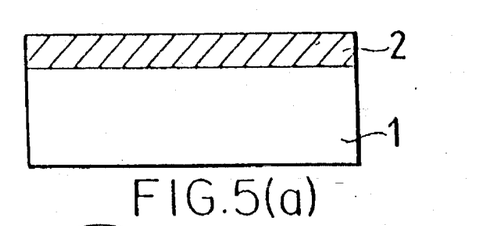
Figure 5B:
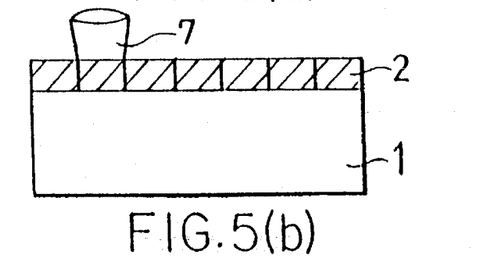
Figure 5C:
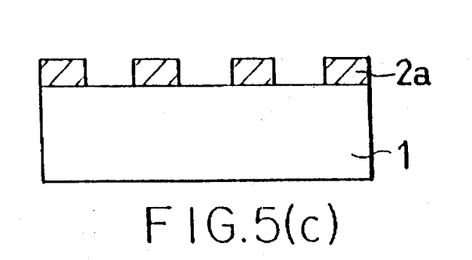
Figure 5D:
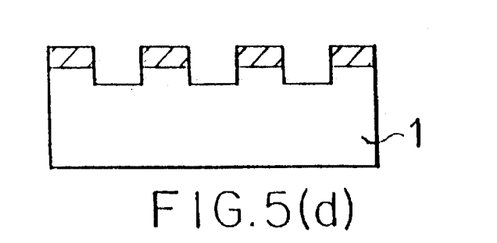
Figure 5E:
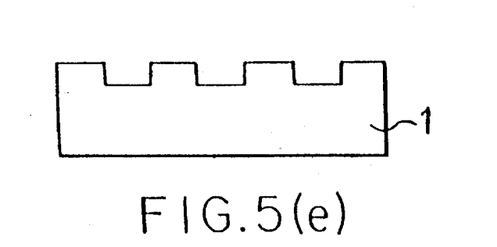

First, as shown in FIGS. 5(a) to 5(c), a glass substrate 1 is coated with photoresist 2, and is irradiated by laser light 7 for cutting. The photoresist 2 is developed to form a desired resist pattern 2a. Then, as shown in FIGS. 5(d) to 5(e), the glass substrate 1 is subjected to spatter etching with a mask of the resist pattern 2a to make a specified pattern, and then the resist pattern 2a is removed.

Figure 5F:
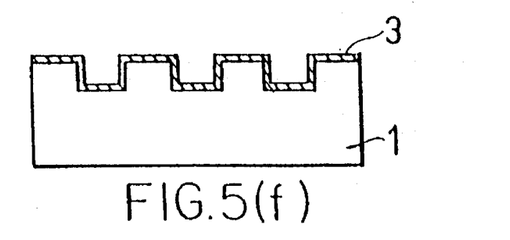
Figure 5G:
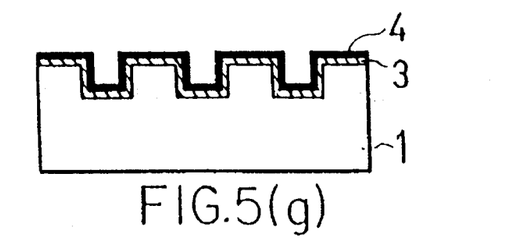

Then, as shown in FIG. 5(f), a tantalum layer 3 is formed by sputtering. The tantalum layer 3 is about 300 Å in thickness. Next, as shown in FIG. (g), a nickel layer 4 is formed by sputtering. The nickel layer 4 is about 300 Å in thickness. After that, the whole substrate is soaked in a solution of 5 wt % potassium dichromate for one minute to form a nickel passive-state film on the nickel layer surface. Thus, the glass master for manufacturing a stamper is finished.

Figure 5H:
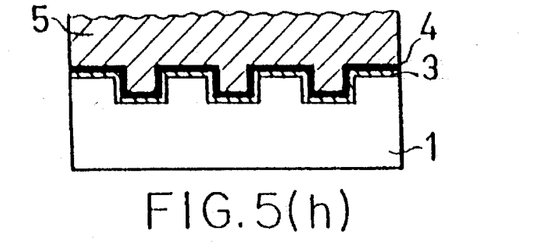
Figure 5I:
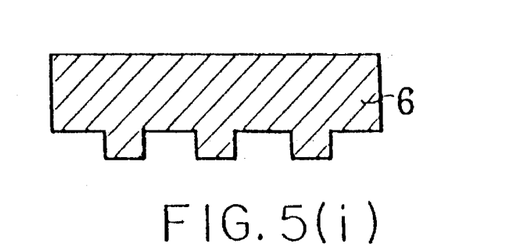

Then, as shown in FIG. 5(h), the glass master is subjected to an electroforming process to form a nickel electroformed layer 5 in 0.3 mm thickness. After that, the nickel electroformed layer alone is separated from the glass master to make a stamper 6 as shown in FIG. 5(i).

(Embodiment 4)

In this embodiment, the glass master employed in the previous embodiment 3 is reused.

Since the master board once used may have a flaw in the nickel passive-state film during a purifying process after the electroformed layer is separated from the glass master, the glass master is purified by a solution of nitric acid to remove the nickel passive-state film and nickel layer.

20 wt % concentration of a solution of nitric acid may be enough.

Following the above steps, the same steps as those shown in the previous embodiment are carried out to form a nickel layer and nickel passive-state film, make a glass master and make a stamper.

The resultant stamper has a good quality without deterioration of an S/N ratio because the nickel passive-state film of the glass master corresponding to a signal face of the stamper is renewed every time it is used, and identical stampers can be newly produced based upon a single glass master.

(Embodiment 5)

Figure 6:
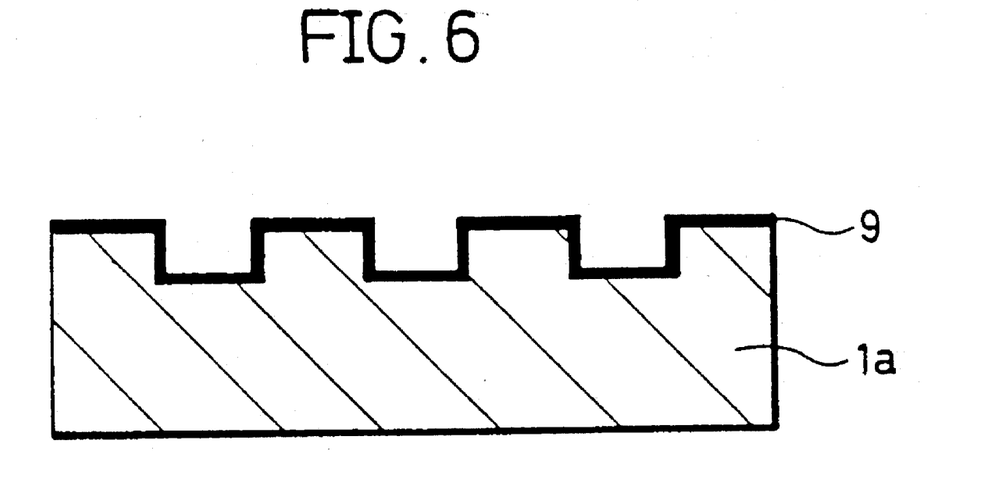
FIG. 6 is a cross-sectional view showing a glass substrate over which a nickel-tantalum alloy conductive layer film is formed.

A case where a nickel-tantalum alloy layer is formed as the conductive layer film A nickel-tantalum alloy conductive layer film 9 containing tantalum at a rate of 3 to 10 wt % is formed in 1000 Å thickness on a surface of the glass master 1a shown in the previous embodiment, by spattering using an alloy target (FIG. 6). After that, a nickel electroformed layer is formed about 300 µm by the electroforming process as stated in the previous embodiment, and then, the conductive layer film is separated from the glass master 1a to make a stamper This is the case where the conductive layer film is prevented from flaking off the glass substrate during the electroforming process by utilizing a property of tantalum tightly sticking to the glass substrate. The conductive layer film easily flakes off when tantalum is contained at a rate of less than 3 wt %, while the conductive layer film sticks so firmly at more than 10 wt % tantalum that the separation of the conductive layer film is impossible.

Alternatively, the conductive layer film of a nickel-tantalum alloy containing tantalum at a rate of 3 to 10 wt % is employed, the above-mentioned problem never arise, and a good stamper can be made.

As previously mentioned, according to the present invention, a substrate is subjected to spatter etching, ion etching or plasma etching to form an irregular pattern, and a conductive layer film having a three-stratum structure where a layer of metal of a smaller linear expansion coefficient than nickel is sandwiched by nickel layers is formed on the substrate. In this way, the resultant conductive layer film can have a smaller linear expansion coefficient than a conventional nickel or silver single-stratum film, silver-nickel two-stratum film, or nickel-silver-nickel three-stratum film, and consequently, the conductive layer film and substrate can have a smaller difference in linear expansion coefficient. Thus, the conductive layer film can be prevented from flaking off the glass master during the electroforming process, and a good stamper can be obtained.

Forming the first and second nickel layers in the same thickness, the conductive layer film can also be prevented from bending with temperature variation. Furthermore, since the conductive layer film having the three-stratum structure can be formed in a vacuum chamber where a vacuum state is maintained without touching the outside air, the layers adhere well to each other, and the electroformed layer can be separated from the glass master between the glass master and the first nickel layer. Thus, a stamper having a good surface accuracy of its signal face and having a high quality can be obtained.

Accordingly, there can be provided a stamper manufacturing method whereby the nickel electroformed layer can be formed on the glass master without flaking the conductive layer film on the surface of the master board any more, and good stampers free from deterioration of an S/N ratio can be newly produced based upon a single master board.

What we claimed is:

1. A stamper comprising an electroformed layer having uneven patterns formed thereon, a second nickel layer formed on said surface of said electroformed layer, an intermediate layer formed on said second nickel layer, said intermediate layer having a smaller linear expansion coefficient than nickel; and a first nickel layer formed on said electroformed layer.

2. A stamper according to claim 1 wherein either said first nickel layer or said second nickel layer has a thickness of 200 to 500 Å.

3. A stamper according to claim 1 wherein said intermediate layer has a thickness of 100 to 500 Å.

4. A stamper according to claim 1 wherein said intermediate layer having a smaller linear expansion coefficient than nickel is tantalum or chromium.

5. A stamper comprising an electroformed layer having uneven patterns, and a nickel-tantalum alloy conductive layer formed on the electroformed layer wherein said nickel-tantalum alloy conductive layer contains from 3 to 10 weight % of tantalum and said electroformed layer comprises nickel.

\* \* \* \* \*